(12) United States Patent
Kwon et al.

(10) Patent No.: US 9,939,693 B2
(45) Date of Patent: Apr. 10, 2018

(54) FRINGE FIELD SWITCHING TYPE LIQUID CRYSTAL DISPLAY HAVING METAL LAYER FOR PROTECTING PAD

(71) Applicant: LG Display Co., Ltd., Seoul (KR)

(72) Inventors: Dhang Kwon, Paju-si (KR); Jungho Son, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/362,411

(22) Filed: Nov. 28, 2016

(65) Prior Publication Data
US 2017/0184926 A1 Jun. 29, 2017

(30) Foreign Application Priority Data

Dec. 28, 2015 (KR) .................... 10-2015-0187541

(51) Int. Cl.
*G02F 1/13* (2006.01)
*G02F 1/1343* (2006.01)
(Continued)

(52) U.S. Cl.
CPC .. *G02F 1/134309* (2013.01); *G02F 1/134363* (2013.01); *G02F 1/136227* (2013.01);
(Continued)

(58) Field of Classification Search
CPC .......... G02F 2001/134318; G02F 2001/13439; G02F 1/13458; G02F 1/13409;
(Continued)

(56) References Cited

U.S. PATENT DOCUMENTS 6,287,899 B1 * 9/2001 Park .................... H01L 21/0274
257/E21.027
7,986,380 B2 * 7/2011 Ahn .................. G02F 1/134363
349/43
(Continued)

FOREIGN PATENT DOCUMENTS

JP 2014-093521 A 5/2014
JP 2014-130321 A 7/2014
JP 2014-202838 A 10/2014

OTHER PUBLICATIONS

Machine translation, Office Action, JPO, translation dated Feb. 5, 2018, all pages.*

(Continued)

*Primary Examiner* — Victoria K Hall
(74) *Attorney, Agent, or Firm* — Polsinelli PC

(57) ABSTRACT

The present disclosure relates to a fringe field switching type liquid crystal display. The present disclosure suggests a fringe field switching type liquid crystal display comprising: a substrate; a gate pad disposed on the substrate; a gate insulating layer covering the gate pad; a data pad disposed on the gate insulating layer; a first passivation layer covering the data pad; a common pad disposed on the first passivation layer; a protective metal layer disposed on the common pad; a second passivation layer covering the common pad; a gate contact hole exposing the gate pad; a data contact hole exposing the data pad; and a common contact hole exposing the protective metal layer.

20 Claims, 7 Drawing Sheets

(51) Int. Cl.
  *G02F 1/1362* (2006.01)
  *H01L 27/12* (2006.01)
  *H01L 29/786* (2006.01)
  *G02F 1/1333* (2006.01)

(52) U.S. Cl.
  CPC ........ *H01L 27/124* (2013.01); *H01L 27/1225* (2013.01); *H01L 29/7869* (2013.01); *H01L 29/78606* (2013.01); *G02F 1/133345* (2013.01); *G02F 2001/133357* (2013.01); *G02F 2001/134372* (2013.01); *G02F 2201/121* (2013.01); *G02F 2201/123* (2013.01); *G02F 2201/50* (2013.01)

(58) Field of Classification Search
  CPC ........... G02F 1/136227; H01L 27/1244; H01L 29/78609; H01L 27/124; H01L 29/78606
  See application file for complete search history.

(56) References Cited

U.S. PATENT DOCUMENTS

| | | | | |
|---|---|---|---|---|
| 8,704,991 | B2* | 4/2014 | Chang | 349/138 |
| 9,711,542 | B2* | 7/2017 | Huang | H01L 27/1262 |
| 2002/0113934 | A1* | 8/2002 | Aoki | G02F 1/1345 349/149 |
| 2003/0017422 | A1* | 1/2003 | Yamaguchi | G02F 1/133553 430/321 |
| 2004/0195574 | A1* | 10/2004 | Ahn | G02F 1/134363 257/72 |
| 2004/0257509 | A1* | 12/2004 | Lee | G02F 1/13458 349/139 |
| 2005/0263769 | A1* | 12/2005 | Chul Ahn | G02F 1/136286 257/72 |
| 2006/0121634 | A1* | 6/2006 | Ahn | G02F 1/134363 438/22 |
| 2006/0138426 | A1* | 6/2006 | Yoo | G02F 1/134363 257/72 |
| 2006/0146255 | A1* | 7/2006 | Ahn | G02F 1/134363 349/141 |
| 2006/0267914 | A1* | 11/2006 | Chang | G02F 1/1345 345/100 |
| 2007/0126969 | A1* | 6/2007 | Kimura | G02F 1/133555 349/141 |
| 2007/0152220 | A1* | 7/2007 | Kwack | G02F 1/1362 257/59 |
| 2011/0080549 | A1* | 4/2011 | Jung | G02F 1/1343 349/141 |
| 2011/0309363 | A1* | 12/2011 | Misaki | G02F 1/13458 257/59 |
| 2012/0212684 | A1* | 8/2012 | Ochiai | G02F 1/13458 348/790 |
| 2012/0280237 | A1 | 11/2012 | Kwack et al. | |
| 2013/0009157 | A1* | 1/2013 | Lee | G02F 1/136286 257/59 |
| 2013/0126876 | A1* | 5/2013 | Shin | H01L 29/6675 257/59 |
| 2014/0145182 | A1* | 5/2014 | Yamazaki | H01L 27/124 257/43 |
| 2014/0159059 | A1* | 6/2014 | Jeong | H01L 27/124 257/79 |
| 2014/0299881 | A1* | 10/2014 | Oda | H01L 27/124 257/59 |
| 2015/0072484 | A1* | 3/2015 | Park | H01L 27/124 438/158 |
| 2015/0214245 | A1* | 7/2015 | Kim | H01L 27/124 257/48 |
| 2015/0355516 | A1* | 12/2015 | Imai | G02F 1/136227 349/123 |
| 2016/0048045 | A1* | 2/2016 | Imai | G02F 1/1337 349/123 |
| 2016/0149043 | A1* | 5/2016 | Choi | H01L 29/7869 257/43 |
| 2016/0180754 | A1* | 6/2016 | Chen | G02F 1/133345 324/760.01 |
| 2017/0068136 | A1* | 3/2017 | Byeon | G02F 1/134363 |
| 2017/0329176 | A1* | 11/2017 | Kawabuchi | G02F 1/133512 |

OTHER PUBLICATIONS

Japanese Office Action, dated Dec. 5, 2017 for the Japanese patent application No. 2016-239062.

* cited by examiner

FRINGE FIELD SWITCHING TYPE LIQUID CRYSTAL DISPLAY HAVING METAL LAYER FOR PROTECTING PAD

CROSS-REFERENCE TO RELATED APPLICATION

This application claims the priority of Korean Patent Application No. 10-2015-0187541 filed in the Republic of Korea on Dec. 28, 2015, which is incorporated by reference herein in its entirety.

BACKGROUND

Field of the Disclosure

The present disclosure relates to a liquid crystal display, and more particularly, to a fringe field switching type liquid crystal display. Although the present disclosure is suitable for a wide scope of applications, it is particularly suitable for preventing damage on a transparent conductive layer when the transparent conductive layer is exposed for connecting with metal layers in etching processes.

Discussion of the Background

Nowadays, various flat panel displays (or 'FPD') are developed for overcoming many drawbacks of the cathode ray tube (or 'CRT') such as heavy weight and bulkiness. The flat panel display devices include a liquid crystal display device (or 'LCD'), a field emission display (or 'FED'), a plasma display panel (or 'PDP'), an organic light emitting display device (or 'OLED') and an electrophoresis display device (or 'ED').

A display panel of the flat panel display includes a thin film transistor substrate having a thin film transistor allocated in each pixel region arrayed in a matrix manner. For example, the liquid crystal display device represents video data by controlling light transmission of a liquid crystal layer by an electric field. Depending on a direction of the electric field, the LCD can be classified in two major types; one is a vertical electric field type and the other is a horizontal electric field type.

For the vertical electric field type LCD, a common electrode on an upper substrate and a pixel electrode on a lower substrate are facing each other for forming an electric field having a direction perpendicular to the substrates. A twisted nematic (TN) liquid crystal layer disposed between the upper substrate and the lower substrate is driven by the vertical electric field. The vertical electric field type LCD has an advantage of a higher aperture ratio, while it has a disadvantage of a narrower viewing angle of about 90 degree.

For the horizontal electric field type LCD, a common electrode and a pixel electrode are formed on the same substrate in parallel. A liquid crystal layer disposed between an upper substrate and a lower substrate is driven in In-Plane-Switching (or 'IPS') mode by an electric field parallel to the substrates. The horizontal electric field type LCD has an advantage of a wider viewing angle over 160 degrees and a response speed faster than that of the vertical electric field type LCD. However, the horizontal electric field type LCD may have disadvantages such as a low aperture ratio and a low transmission ratio of the back light.

In the IPS mode LCD, for example, in order to form an in-plane electric field, the gap between the common electrode and the pixel electrode may be larger than the gap (or "Cell Gap") between the upper substrate and the lower substrate, and in order to get enough strength of the electric field, the common electrode and the pixel electrode need to be formed of a strip pattern having a certain width. Between the pixel electrode and the common electrode of the IPS mode LCD, the electric field horizontal with respect to the substrate is formed. However, just over the pixel electrode and the common electrode, there is no electric field. That is, the liquid crystal molecules disposed just over the pixel electrodes and the common electrodes can not be driven but maintain the initial conditions (i.e., the initial alignment direction). As the liquid crystal molecules in the initial condition cannot control the light transmission properly, the aperture ratio and the luminescence can be degraded.

For resolving these disadvantages of the IPS mode LCD, the fringe field switching (or 'FFS') type LCD driven by the fringe electric field has been proposed. The FFS type LCD comprises the common electrode and the pixel electrode with the insulating layer there-between. The pixel electrode and the common electrode are overlapped in a vertical direction. Otherwise, the pixel electrode and the common electrode do not overlap each other but are separated from each other by a gap setting narrower than the gap between the upper substrate and the lower substrate. A fringe electric field having a parabola shape is formed in the space between the common electrode and the pixel electrode as well as over these electrodes. Therefore, most of liquid crystal molecules disposed between the upper substrate and the lower substrate can be driven by the fringe field. As a result, the aperture ratio and the front luminescence can be improved.

For the fringe field type liquid crystal display, the common electrode and the pixel electrode are disposed closely to each other or in an overlapped manner. A storage is formed between the common electrode and the pixel electrode. Therefore, the fringe field type liquid crystal display has an advantage in that there is no extra space required for forming the storage in the pixel region. However, when a large area display is formed with a fringe field type, the pixel region becomes larger and the storage becomes larger as well. In that case, the thin film transistor should have also a larger size for driving/charging the enlarged storage for a short time period.

To solve this problem, a thin film transistor having a metal oxide semiconductor material is used because it has high current control characteristics without enlarging the size of the thin film transistor. FIG. 1 is a plan view illustrating a thin film transistor substrate having an oxide semiconductor layer included in a fringe field type liquid crystal display according to the related art. FIG. 2 is a cross-sectional view illustrating a structure of the thin film transistor substrate of FIG. 1 along line I-I' according to the related art.

The thin film transistor substrate having a metal oxide semiconductor layer shown in FIGS. 1 and 2 comprises a gate line GL and a data line DL crossing each other with a gate insulating layer GI therebetween on a lower substrate SUB, and a thin film transistor T formed at each crossing portion. By the crossing structure of the gate line GL and the data line DL, a pixel region is defined.

The thin film transistor T comprises a gate electrode G branched (or 'extruded') from the gate line GL, a source electrode S branched from the data line DL, a drain electrode D facing the source electrode S and connecting to the pixel electrode PXL, and a semiconductor layer A overlapping the gate electrode G on the gate insulating layer GI for forming a channel between the source electrode S and the drain electrode D.

The semiconductor layer A formed of an oxide semiconductor material has an advantage for a large area thin film transistor substrate having a large charging capacitance due to a high electron mobility of the oxide semiconductor layer.

However, the thin film transistor having the oxide semiconductor material may need an etch stopper ES for protecting the upper surface of the semiconductor layer from the etching material for ensuring a stability and characteristics of the thin film transistor. More specifically, an etch stopper ES is needed to protect the semiconductor layer A from an etchant when the source electrode S and the drain electrode D are formed therebetween.

At one end of the gate line GL, a gate pad GP is formed for receiving a gate signal. The gate pad GP is connected to a gate pad terminal GPT through the gate pad contact hole GPH penetrating through the first passivation layer PA1 and the second passivation layer PA2. Further, at one end of the data line DL, a data pad DP is formed for receiving a pixel signal. The data pad DP is connected to a data pad terminal DPT through the data pad contact hole DPH penetrating through the first passivation layer PA1 and the second passivation layer PA2.

In the pixel region, a pixel electrode PXL and a common electrode COM are formed with the second passivation layer PA2 therebetween, to generate a fringe electric field. The common electrode COM is connected to the common line CL disposed in parallel with the gate line GL. The common electrode COM is supplied with a reference voltage (or "common voltage") via the common line CL.

The common electrode COM and the pixel electrode PXL can have various shapes and positions depending on the design purpose and environment. While the common electrode COM is supplied with a reference voltage having a constant value, the pixel electrode PXL is supplied with a data voltage varying timely according to the video data. Therefore, between the data line DL and the pixel electrode PXL, a parasitic capacitance may be formed. Due to the parasitic capacitance, a video quality of the display may be degraded. Therefore, the common electrode COM is formed first and then the pixel electrode PXL is formed on the topmost layer.

In other words, on the first passivation layer PA1 covering the data line DL and the thin film transistor T, a planarization layer PAC is formed by depositing a thick organic material having a low permittivity. Then, the common electrode COM is formed. And then, after depositing the second passivation layer PA2 to cover the common electrode COM, the pixel electrode PXL overlapping the common electrode is formed on the second passivation layer PA2. In this structure, the pixel electrode PXL is located with distances from the data line DL by the first passivation layer PA1, the planarization layer PAC and the second passivation layer PA2, so that the parasitic capacitance between the data line DL and the pixel electrode PXL can be reduced.

The common electrode COM is formed to be a rectangular shape corresponding to the pixel region. The pixel electrode PXL is formed to have a plurality of segments. Especially, the pixel electrode PXL vertically overlaps the common electrode COM with the second passivation layer PA2 therebetween. Between the pixel electrode PXL and the common electrode COM, the fringe electric field is formed. By this fringe electric field, the liquid crystal molecules arrayed in plane direction between the thin film transistor substrate and the color filter substrate may be rotated according to the dielectric anisotropy of the liquid crystal molecules. According to the rotation degree of the liquid crystal molecules, the light transmittance ratio of the pixel region may be changed so as to represent a desired gray scale.

The pads GP and DP are exposed by patterning insulating layers covering them. The exposed pads GP and DP are covered by the pad terminals GPT and DPT formed by the transparent conductive material used for the pixel electrode PXL. Further, the pad for the common electrode COM is also exposed by patterning the second passivation layer PA2.

At the pad area, for receiving signals from the outside controller, the insulating layers are patterned for exposing the pads. However, as described above, the number and kinds of the insulation layers covering the pad are different. Thus, the exposed pads may have damage. Hereinafter, referring to FIGS. 3 and 4, the damage which occurred at the pads is explained as follows. FIG. 3 is a cross sectional view illustrating a process for forming a contact hole exposing pads of the fringe field switching type liquid crystal display according to the related art. FIG. 4 is a cross sectional view illustrating damages occurred at the pads after etching the insulating layers used by the method shown in FIG. 3.

Referring to FIG. 3, at the pad area of the fringe field switching type liquid crystal display, a gate pad GP, a data pad DP and a common pad CP are disposed. The gate pad GP is one end portion of the gate line GL. The data pad DP is one end portion of the data line DL. The common pad CP is one end of the common line CL.

On the gate pad GP, a gate insulating layer GI, a first passivation layer PA1 and a second passivation layer PA2 are sequentially formed. On the data pad DP, the first passivation layer PA1 and the second passivation layer PA2 are stacked. On the contrary, on the common pad CP, only the second passivation layer PA2 is disposed. In order to expose portions of the gate pad GP, the data pad DP and the common pad CP at the same time using one mask process, the gate insulating layer GI, the first passivation layer PA1 and the second passivation layer PA2 needs to be patterned in one etching step.

At the gate pad GP, to form a gate contact hole GPH, three insulating layers need to be etched with the sequence of ①→②→③. Consequently, at the data pad DP, to form a data contact hole DPH, two insulating layers need to be etched with the sequence of ①→②. Simultaneously, at the common pad CP, to form a common contact hole CPH, one insulating layer ① needs to be etched.

When portions of the gate pad GP, the common pad CP and the data pad DP are etched, these pads are constantly exposed to the etchant. As the data pad DP includes a metal material such as copper, it may not be damaged by the etchant for patterning the insulating layers even though it is affected by the etchant during the gate pad GP is exposed. On the other hand, the common pad CP is formed of a transparent conductive material such as indium-tin oxide and indium-zinc oxide. Therefore, these transparent conductive materials can be easily damaged by the etchant when the gate pad GP is exposed.

By being exposed to the etchant, the transparent conductive material can be partially crystallized so that grains can be formed. As boundaries of the grains are easily damaged by the etchant used in the dry etching process for patterning the insulating layers. Then, the second passivation layer PA2 disposed under the damaged transparent conductive material can be etched away. For example, trench shaped patterns can be formed at the second passivation layer PA2 as shown in FIG. 4. Such patterns can not properly protect the conductive layer thereunder. When electrical signals are supplied through such defective patterns, an electrical insulation property cannot be ensured by these defective patterns so that the signals cannot be properly applied to the pixel electrode. Consequently, video images of the LCD display can be defective.

SUMMARY

Accordingly, the present disclosure is directed to a fringe field switching type liquid crystal display that substantially obviates one or more of problems due to limitations and disadvantages of the related art.

In order to overcome the above mentioned drawbacks, an aspect of the present disclosure is to suggest a liquid crystal display having a structure for protecting the pads exposed from the etchants during the dry etching process for patterning the insulating layers. Another purpose of the present disclosure is to suggest a liquid crystal display having a structure for keeping the interface properties in best condition between the pad terminals (including a transparent conductive material) and the protective metal layer (including a low resistance metal material such as the copper).

In order to accomplish the above purpose, an aspect of the present disclosure suggests a fringe field switching type liquid crystal display comprising: a substrate; a gate pad disposed on the substrate; a gate insulating layer covering the gate pad; a data pad disposed on the gate insulating layer; a first passivation layer covering the data pad; a common pad disposed on the first passivation layer; a protective metal layer disposed on the common pad; a second passivation layer covering the common pad; a gate contact hole exposing the gate pad; a data contact hole exposing the data pad; and a common contact hole exposing the protective metal layer.

In other aspects, the protective metal layer includes a plurality of unit protective metal layers disposed on the common pad in a matrix manner, and the common contact hole includes a plurality of unit common contact holes exposing each of the unit protective metal layers.

In other aspects, the unit protecting metal layer has a larger area than the unit common contact hole.

In other aspects, the gate pad is disposed at one end of a gate line, the data pad is disposed at one end of a data line, and the common pad is disposed at one end of a common line.

In other aspects, the common pad includes a transparent conductive material having at least one of an indium-tin oxide and an indium-zinc oxide; and the protective metal layer includes a conductive material having lower resistance than the transparent conductive material.

In other aspects, the protective metal layer includes at least one of copper and copper alloy.

In other aspects, the liquid crystal display further comprises: a gate pad terminal contacting the gate pad through the gate contact hole; a data pad terminal contacting the data pad through the data contact hole; and a common pad terminal contacting the common pad through the common contact hole.

In other aspects, the liquid crystal display further comprises: a common electrode connecting to the common pad on the first passivation layer; and a pixel electrode having a plurality of segments overlapping the common electrode on the second passivation layer.

In the present disclosure, the fringe field switching type liquid crystal display includes a protective metal layer stacked/disposed on the pad including a transparent conductive material. By the protective metal layer, the pad can be protected from the etchants used in the patterning process for exposing the pad by etching the insulating layers. Further, the protective metal layer includes a plurality of unit protective metal layers having a size corresponding to the size of the contact hole. The contact hole has the minimum opening size with satisfying the condition not to increase the contact resistance. As the result, the best interface properties between the protective metal layer having the low resistance metal such as a copper and the pad having the transparent conductive material can be ensured. According to the present disclosure, the problem that the interface properties are degraded as the contact area is enlarged, when two different conductive materials are stacked, can be prevented.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate aspects of the present disclosure and together with the description serve to explain the principles of the disclosure.

In the drawings.

DETAILED DESCRIPTION

Figure 1:
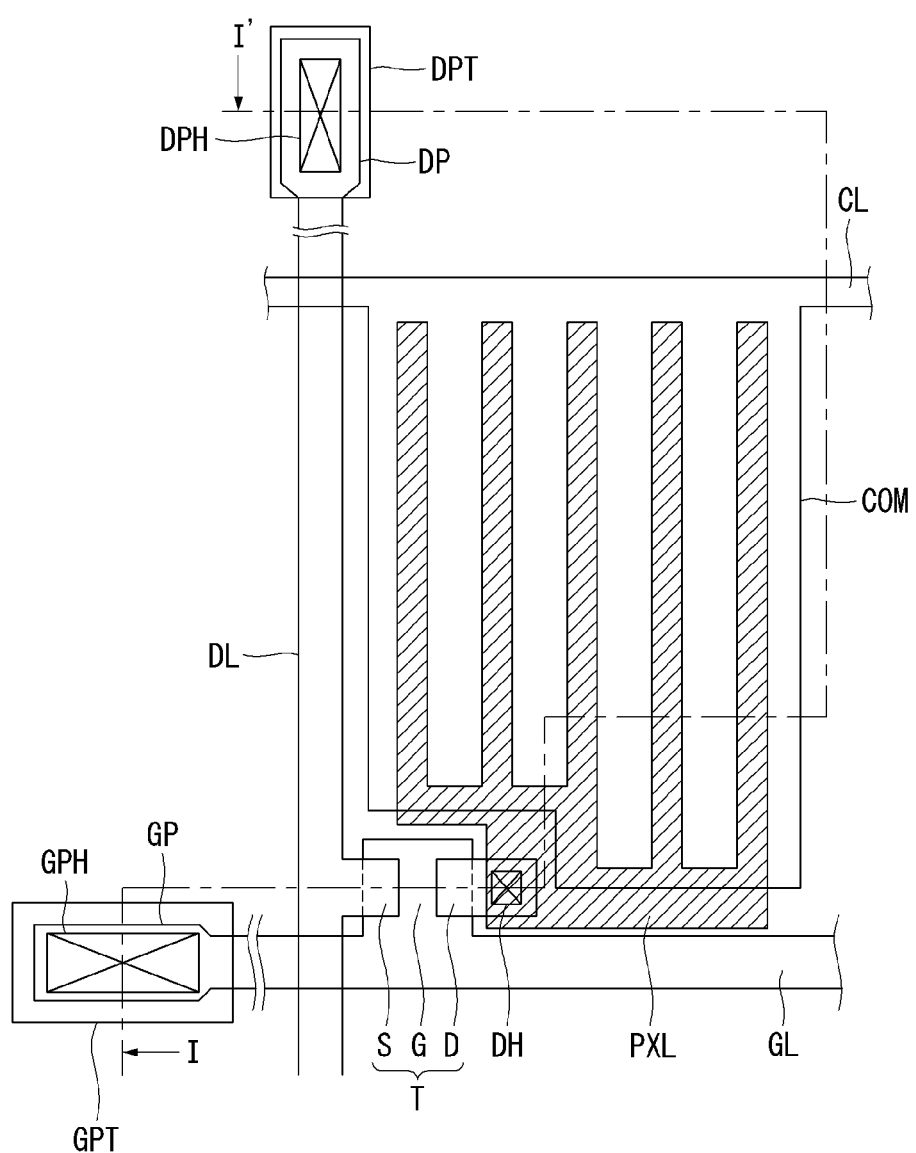
FIG. 1 is a plan view illustrating a thin film transistor substrate included in a fringe field type liquid crystal display according to the related art.
Figure 2:
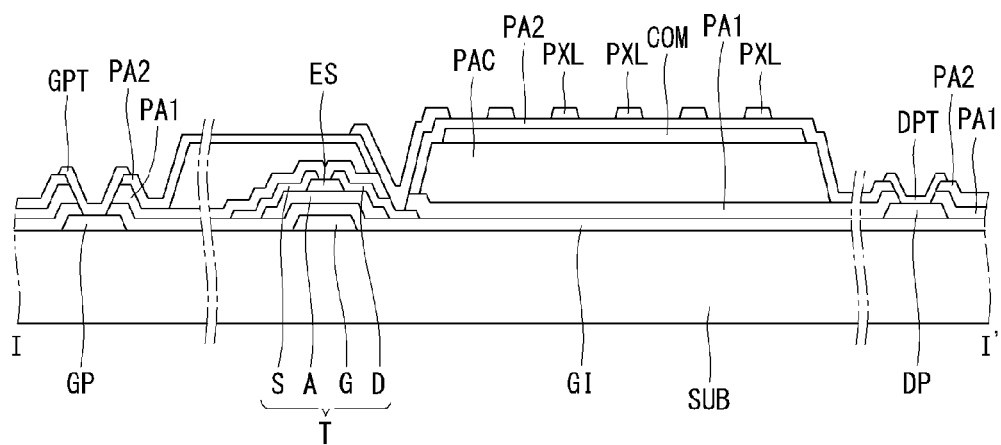
FIG. 2 is a cross-sectional view illustrating a structure of the thin film transistor substrate of FIG. 1 along line I-I' according to the related art.
Figure 3:
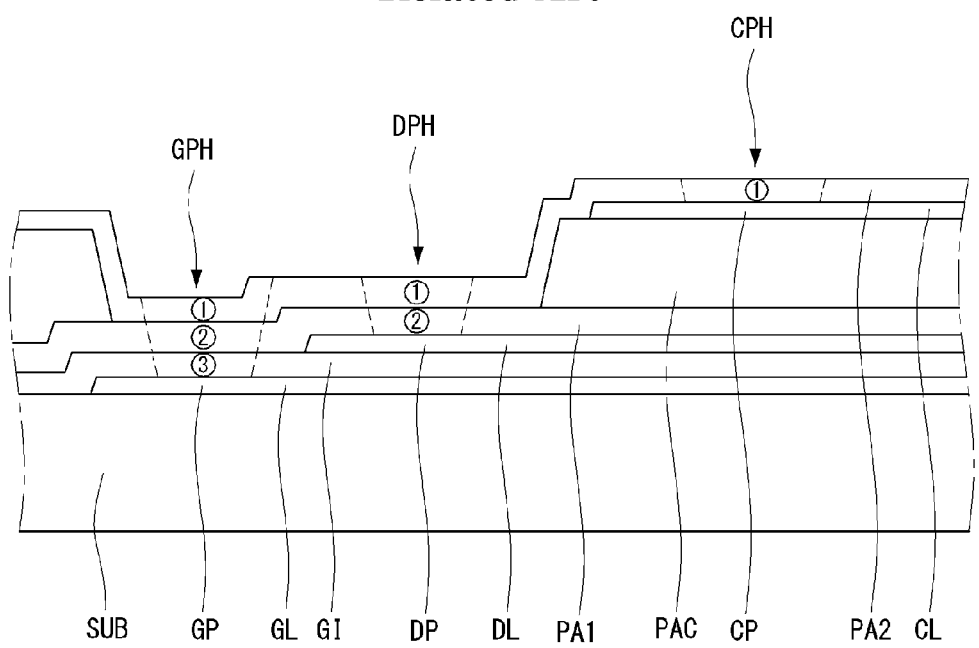
FIG. 3 is a cross-sectional view illustrating a process for forming a contact hole exposing pads of the fringe field switching type liquid crystal display according to the related art.
Figure 4:
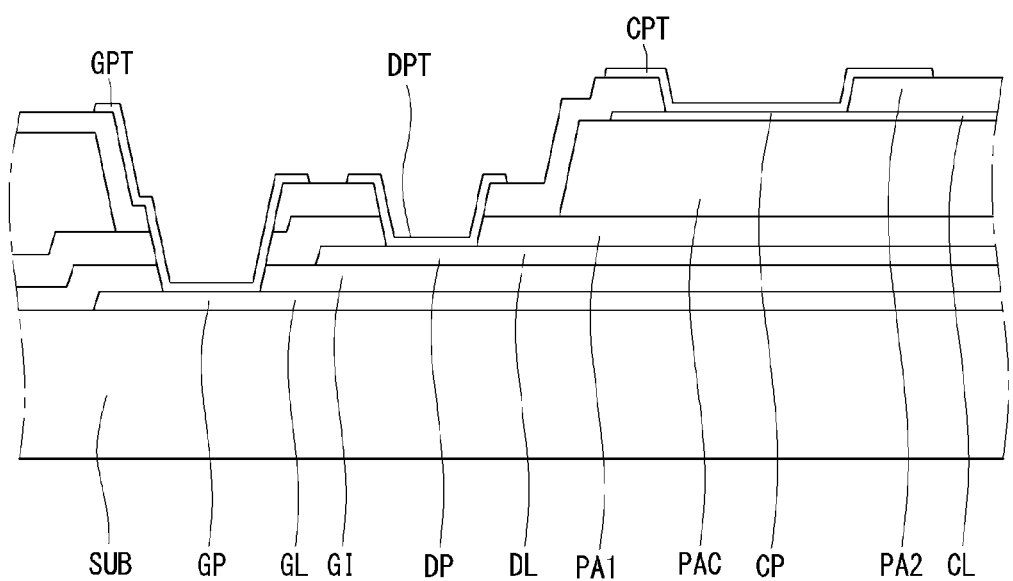
FIG. 4 is a cross-sectional view illustrating damage which occurred at pads after etching insulating layers by the process shown in FIG. 3.

Referring to attached figures, aspects of the present disclosure will be described. Like reference numerals designate like elements throughout the detailed description. However, the present disclosure is not restricted by these aspects but can be applied to various changes or modifications without changing the technical spirit. In the following aspects, the names of the elements are selected for ease of explanation and may be different from actual names.

In the followings, explanations on the pad part, the main elements of the present disclosure will be provided more fully. However any explanations for display area and figures for the related arts may be used whenever necessary.

Figure 5:
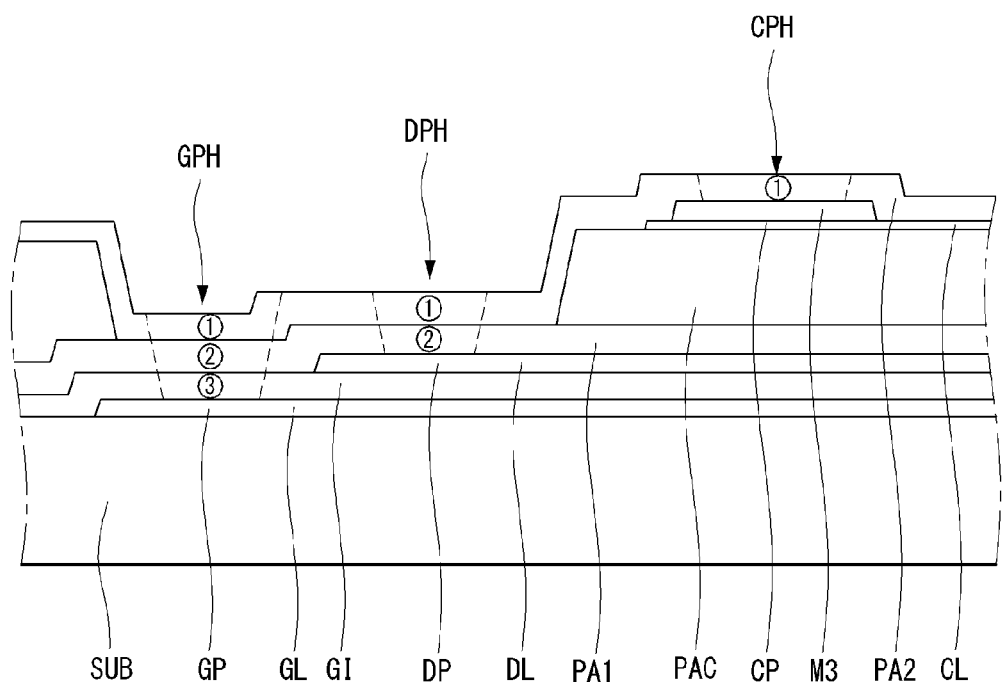
FIG. 5 is a cross-sectional view illustrating a process for forming a contact hole exposing a pad area in a fringe field switching type liquid crystal display according to an aspect of the present disclosure.
Figure 6:
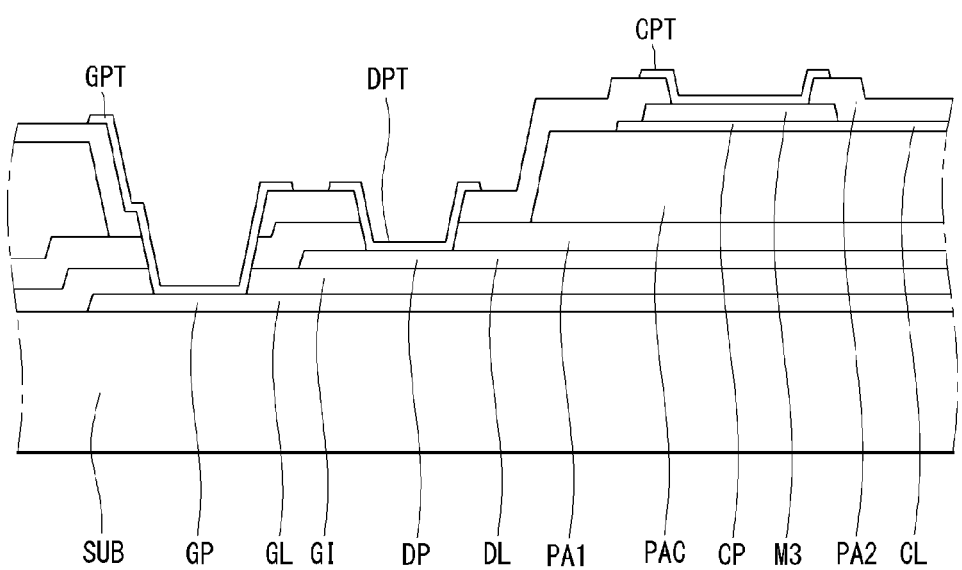
FIG. 6 is a cross-sectional view illustrating a structure of the pad area having no damage after patterning the insulating layers by the process shown in FIG. 5.

FIG. 5 is a cross-sectional view illustrating a process for forming a contact hole exposing a pad area in a fringe field switching type liquid crystal display according to an aspect of the present disclosure. FIG. 6 is a cross-sectional view illustrating a structure of the pad area having no damage after patterning the insulating layers by the process shown in FIG. 5.

Referring to FIG. 5, in the fringe field switching type liquid crystal display according to an aspect of the present disclosure, the pad area includes a gate pad GP, a data pad DP and a common pad CP. The gate pad GP is one end portion of a gate line GL. The gate pad GP may be formed of the same metal material as the gate line GL. The data pad DP is one end portion of a data line DL. The date pad DP may be formed of the same metal material as the data line DL.

The common pad CP is one end portion of a common line CL. The common pad CP may be formed of the same material as the common line CL. For example, the common pad CP may be formed of a transparent conductive material such as indium-tin oxide (ITO) and indium-zinc-oxide (IZO). On the upper surface of the common pad CP, a protective metal layer M3 is disposed thereon. The protective metal layer M3 is formed of a metal material for preventing the transparent conductive material of the common pad CP from being damaged by dry etchants. For example, the protective metal layer M3 may be formed of one of copper (Cu), titanium (Ti), nickel (Ni), molybdenium (Mo) and any alloys thereof.

The common pad CP has the same structure as the common electrode COM and/or the common line CL disposed in the display area. The common line CL has a structure to be connected with all pixel areas over the entire display panel. As the common line CL is applied with a ground level voltage, it is formed of a material having a resistance lower than the transparent conductive material such as indium thin oxide and indium zinc oxide. For example, the common line CL may have a low resistance metal layer such as copper stacked on the transparent conductive material. Therefore, the protective metal layer M3 may be the same material as the low resistance metal material stacked on the common line CL.

On the gate pad GP, a gate insulating layer GI, a first passivation layer PA1 and a second passivation layer PA2 are stacked sequentially. On the data pad DP, the first passivation layer PA1 and the second passivation layer PA2 are sequentially stacked. Further, on the common pad CP and the protective metal layer M3, only the second passivation layer PA2 is stacked thereon. In order to expose portions of the gate pad GP, the data pad DP and the common pad CP using the same one mask process, the gate insulating layer GI, the first passivation layer PA1 and the second passivation layer PA2 need to be concurrently patterned at the same time.

With the one same mask process, a gate contact hole GPH is formed by etching the three insulating layers on the gate pad GP in the sequence of ①→②→③. A data contact hole DPH is formed by etching the two insulating layers on the data pad DP in the sequence of ①→②. Further, a common contact hole CPH is formed by etching the one insulating layer ①.

As these insulating layers are patterned by a dry etching process, the common pad CP and the data pad DP are also constantly exposed to the etchant when the gate pad GP is exposed. The data pad DP is less damaged by the etchant while the gate pad GP is exposed. This is because the data pad DP is formed of a metal material such as copper. For the common pad CP, copper (Cu) covers the transparent conductive material such as indium tin oxide and indium zinc oxide. Therefore, even though it is exposed to the etchant when the gate pad GP is exposed, the common pad CP can be protected from the etchant by a protective metal layer M3, as shown in FIG. 6.

On the second passivation layer PA2 having contact holes, pad terminals can be formed by depositing/patterning a transparent conductive material the same as the pixel electrode PXL. For example, a gate pad terminal GPT contacts the gate pad GP through the gate pad contact hole GPH. A data pad terminal DPT contacts the data pad DP through the data pad contact hole DPH. Further, a common pad terminal CPT contacts the common pad CP through the common pad contact hole CPH. Further, the common pad terminal CPT contacts the protective metal layer M3 exposed through the common pad contact hole CPH as shown in FIG. 6.

However, the same structure as the pad area can be applied to other areas in the non-display area. For example, signal linking lines and/or electrodes may be formed using the same material as the data line and the common line. These lines and/or electrodes may be connected using the same material with the pixel electrode after exposing portions of the lines and/or the electrodes.

By applying the protective metal layer M2 at these exposed portions, the transparent conductive material can be protected from the exposure of the dry etchant. These electrodes and/or lines disposed in the non-display area may have a relatively large area. When a relatively large area is exposed, the protective metal layer M3 on the transparent conductive material may also have a relatively large area.

The protective metal layer M3 may be formed of a low resistance metal material such as copper (Cu) and aluminium (Al). In case of copper, the interface between copper and the transparent conductive material may have contact defects. This can be caused by a difference in surface stresses of the copper film and the transparent conductive film. Specifically, the interface contact defects become worse when the contact surface area becomes larger. Another aspect of the present disclosure is to provide a structure for eliminating and/or reducing the interface stress difference between the protective metal layer M3 including copper and the transparent conductive material when the protective layer M3 is stacked on the transparent conductive material.

Figure 7:
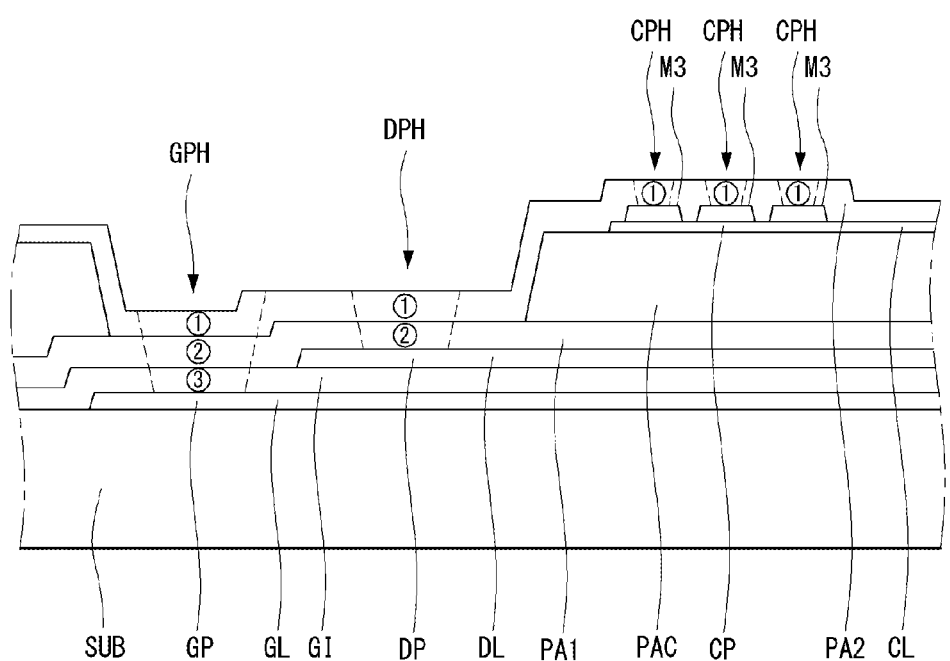
FIG. 7 is a cross-sectional view illustrating a process for forming a contact hole exposing a pad area in a fringe field switching type liquid crystal display according to another aspect of the present disclosure.
Figure 8:
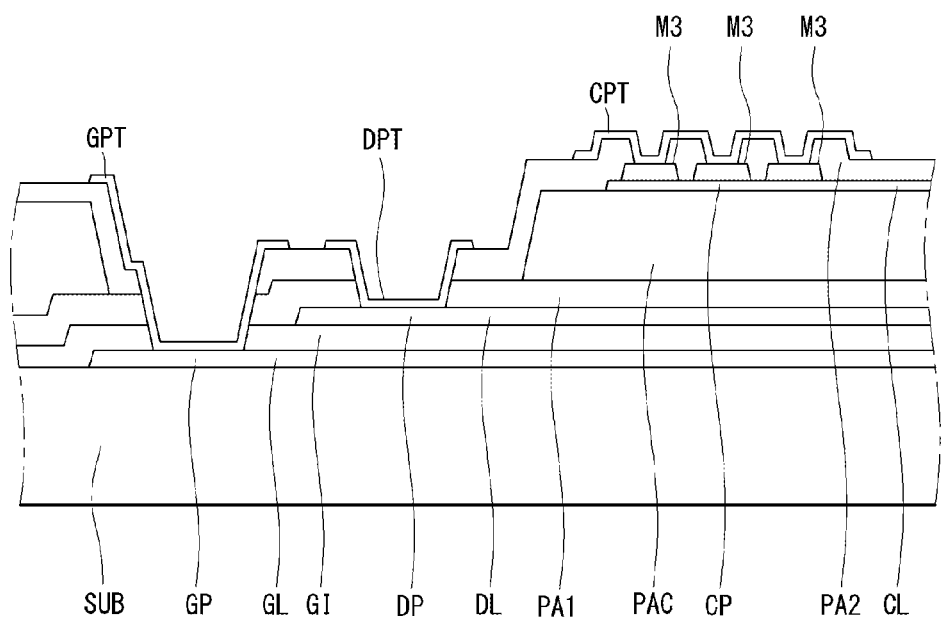
FIG. 8 is a cross-sectional view illustrating a structure of the pad area in the fringe field switching type liquid crystal display according to another aspect of the present disclosure.

FIG. 7 is a cross-sectional view illustrating a process for forming a contact hole exposing a pad area in the fringe field switching type liquid crystal display according to another aspect of the present disclosure. FIG. 8 is a cross-sectional view illustrating a structure of the pad area in the fringe field switching type liquid crystal display according to another aspect of the present disclosure.

Referring to FIG. 7, in the fringe field switching type liquid crystal display, the pad area includes a gate pad GP, a data pad DP and a common pad CP. The gate pad GP is one end portion of a gate line GL. The gate pad GP may be formed of the same metal material as the gate line GL. The data pad DP is one end portion of a data line DL. The date pad DP may be formed of the same metal material as the data line DL.

The common pad CP is one end portion of a common line CL. The common pad CP may be formed of the same material as the common line CL. For example, the common pad CP may be formed of a transparent conductive material such as indium-tin oxide (ITO) and indium-zinc-oxide (IZO). On the upper surface of the common pad CP, a protective metal layer M3 is stacked thereon. The protective metal layer M3 may be formed of a metal material for preventing the transparent conductive material of the common pad CP from being damaged by dry etchants. For example, the protective metal layer M3 may be formed of one of copper (Cu), titanium (Ti), nickel (Ni), molybdenium (Mo) and any alloys thereof.

The common pad CP has the same structure as the common electrode COM and/or the common line CL disposed in the display area. The common line CL has an extended structure to be connected with all pixel areas over the entire display panel. As the common line CL is applied with a ground level voltage, it may be formed of a material having a resistance lower than the transparent conductive material such as indium thin oxide and indium zinc oxide. For example, the common line CL may be formed of a low resistance metal layer such as copper stacked on the transparent conductive material. Therefore, the protective metal layer M3 may be the same material as the low resistance metal material stacked on the common line CL.

Another aspect of the present disclosure is to provide a structure for improving the interface properties between the common pad CP and the protective metal layer M3 stacked on the common pad CP. For example, with the protective metal layer M3 having a minimum contact surface area, a plurality of the protective metal layer M3 can be arrayed on the common pad CP. As a result, a minimum contact area can be maintained between the single protective metal layer M3 and the common pad CP, thereby swelling or peeling of the protective metal layer M3 from the common pad CP can be prevented.

However, a minimum contact area between the protective metal layer M3 and the common pad CP can not be maintained without limitations. The protective metal layer M3 is an area exposed through the common pad contact hole CPH. The exposed area of the protective metal layer M3 through the common pad contact hole CPH may be an area electrically contacted with the connecting metal layer deposited thereon in a later process. Therefore, the contact hole needs to have a minimum size. Further, the minimum area of the contact hole satisfies the condition in which the contact resistance between two conductive layers contacting through the contact hole is not increased. A single protective metal layer M3 has a size corresponding to the minimum size of the contact hole.

For example, when the minimum size of the common pad contact hole CPH is a μm×b μm the size of the single protective metal layer M3 can be 5 μm larger than the minimum size of the common pad CPH, at each side. That is, the size of the single protective metal layer M3 can be (a+10) μm×(b+10) μm, where a and b are any positive number greater than 0. Here, the minimum size of the common pad contact hole CPH means the minimum size of the contact hole in which the contact resistance with the common pad CP is not increased.

According to another aspect of the present disclosure, a plurality of the protective metal layers M3 is arrayed on the common pad CP in a matrix manner. The size of a single protective metal layer M3 corresponds to the minimum size of the contact hole. As a result, the interface properties between the common pad CP including the transparent conductive material and the protective metal layer M3 including the copper material can be maintained strongly without any peeling problem.

On the gate pad GP, a gate insulating layer GI, a first passivation layer PA1 and a second passivation layer PA2 are stacked sequentially. On the data pad DP, the first passivation layer PA1 and the second passivation layer PA2 are sequentially stacked. Further, on the common pad CP and the protective metal layer M3, only the second passivation layer PA2 is stacked thereon. In order to expose portions of the gate pad GP, the data pad DP and the common pad CP using the same one mask process, the gate insulating layer GI, the first passivation layer PA1 and the second passivation layer PA2 need to be concurrently patterned at the same time.

With the one same mask process, a gate contact hole GPH is formed by etching the three insulating layers on the gate pad GP in the sequence of ①→②→③. A data contact hole DPH is formed by etching the two insulating layers on the data pad DP in the sequence of ①→②. Further, a common contact hole CPH is formed by etching the one insulating layer ①.

As these insulating layers are patterned by a dry etching process, the common pad CP and the data pad DP can also be exposed when the gate pad GP is exposed to the etchant. The data pad DP may not be damaged so much by the etchant while the gate pad GP is exposed. This is because the data pad DP is formed of a metal material such as copper. As to the common pad CP, copper (Cu) covers the transparent conductive material such as indium tin oxide and indium zinc oxide. Therefore, even though it is also exposed to the etchant when the gate pad GP is exposed, the common pad CP can be protected from the etchant by the protective metal layer M3.

On the second passivation layer PA2 having contact holes, pad terminals can be formed by depositing/patterning a transparent conductive material the same as the pixel electrode PXL. For example, a gate pad terminal GPT contacts the gate pad GP through the gate pad contact hole GPH. A data pad terminal DPT contacts the data pad DP through the data pad contact hole DPH. Further, a common pad terminal CPT contacts the common pad CP through the common pad contact hole CPH. Especially, the common pad terminal CPT contacts a plurality of the protective metal layer M3 exposed through a plurality of common pad contact holes CPH.

For the fringe field switching type liquid crystal display according to the second embodiment of the present disclosure, the top surface of the common pad CP is prevented from being damaged because the protective metal layer M3 is stacked on the common pad CP. Further, a plurality of the protective metal layers M3 having the minimum contact area is arrayed on the common pad CP, so that they are not easily peeled off or have no contact defects.

While the aspects of the present disclosure have been described in detail with reference to the drawings, it will be understood by those skilled in the art that the aspects can be implemented in other specific forms without changing the technical spirit or essential features of the disclosure. Therefore, it should be noted that the forgoing aspects are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

What is claimed is:

1. A liquid crystal display having a substrate, comprising:
   a gate pad disposed on the substrate;
   a gate insulating layer covering the gate pad including the substrate;
   a data pad disposed on the gate insulating layer;
   a first passivation layer covering the data pad;
   a common pad disposed on the first passivation layer;
   a protective metal layer protecting the common pad from an etchant and disposed on the common pad;
   a second passivation layer on the common pad;
   a gate contact hole exposing the gate pad;
   a data contact hole exposing the data pad; and
   a common contact hole exposing the protective metal layer.

2. The liquid crystal display according to claim 1,
wherein the protective metal layer comprises a plurality of unit protective metal layers disposed on the common pad in a matrix form, and
wherein the common contact hole comprises a plurality of unit common contact holes exposing each of the unit protective metal layers.

3. The liquid crystal display according to claim 2, wherein the unit protecting metal layers has an area larger area than the unit common pad contact hole.

4. The liquid crystal display according to claim 2, wherein the unit protective metal layer has a size of (a+10) μm×(b+10) μm where the unit common pad contact hole has a size of a μm×b μm.

5. The liquid crystal display according to claim 1,
wherein the gate pad is disposed at one end of a gate line,
wherein the data pad is disposed at one end of a data line, and
wherein the common pad is disposed at one end of a common line.

6. The liquid crystal display according to claim 1,
wherein the common pad is formed of a transparent conductive material.

7. The liquid crystal display according to claim 6, wherein the protective metal layer is formed of a conductive material having a resistance lower than that of the transparent conductive material.

8. The liquid crystal display according to claim 6, wherein the conductive material is selected from the group consisting of copper, titanium, nickel, molybdenum and any alloys thereof.

9. The liquid crystal display according to claim 1, further comprising:
a gate pad terminal contacting the gate pad through a gate pad contact hole;
a data pad terminal contacting the data pad through a data pad contact hole; and
a common pad terminal contacting the common pad through a common pad contact hole.

10. The liquid crystal display according to claim 1, further comprising:
a common electrode connecting to the common pad on the first passivation layer; and
a pixel electrode overlapping the common electrode on the second passivation layer.

11. A liquid crystal display having a substrate, comprising:
a planarization layer over the substrate;
a common pad on the planarization layer;
a protective metal layers protecting the common pad from an etchant and disposed on the common pad; and
a common pad terminal contacting the common pad through a plurality of common pad contact holes,
wherein the protective metal layer has an area larger than the common pad contact hole.

12. The liquid crystal display according to claim 11, wherein the protective metal layer has a size of (a+10) μm×(b+10) μm where each of the plurality of common pad contact holes has a size of a μm×b μm.

13. The liquid crystal display according to claim 11, wherein the common pad is disposed at one end of a common line.

14. The liquid crystal display according to claim 11, wherein the common pad is formed of a transparent conductive material.

15. The liquid crystal display according to claim 14, wherein the protective metal layer is formed of a conductive material having a resistance lower than that of the transparent conductive material.

16. The liquid crystal display according to claim 14, wherein the conductive material is selected from the group consisting of copper, titanium, nickel, molybdenum and any alloys thereof.

17. The liquid crystal display according to claim 14, wherein the transparent conductive material is selected from the group consisting of indium tin oxide and indium zinc oxide.

18. The liquid crystal display according to claim 11, further comprising a common electrode connected to the common pad on the planarization layer.

19. The liquid crystal display according to claim 11, wherein the protective metal layer comprises a plurality of unit protective metal layers disposed on the common pad in a matrix form, and the common contact hole comprises a plurality of unit common contact holes exposing each of the unit protective metal layers.

20. The liquid crystal display according to claim 13, wherein the common pad is formed of a same material as the common line.

* * * * *